United States Patent

Haselwood et al.

[11] 4,048,562
[45] Sept. 13, 1977

[54] MONITORING SYSTEM FOR VOLTAGE TUNABLE RECEIVERS AND CONVERTERS UTILIZING VOLTAGE COMPARISON TECHNIQUES

[75] Inventors: Donald E. Haselwood, Clearwater; Carl M. Solar, Largo; Jeffrey R. Thumm, Clearwater, all of Fla.

[73] Assignee: A. C. Nielsen Company, Northbrook, Ill.

[21] Appl. No.: 580,054

[22] Filed: May 22, 1975

[51] Int. Cl.² ............................................. H04B 17/00
[52] U.S. Cl. ................ 325/31; 179/2 AS; 324/78 D; 325/455; 334/86; 340/347 AD, 340/347 DA
[58] Field of Search ................ 325/31, 53, 308, 455; 178/DIG. 13; 179/2 AS; 334/86, 87; 324/78 D, 78 J, 79 D, 99 D; 340/347 AD, 347 DD

[56] References Cited

U.S. PATENT DOCUMENTS

| | | | |
|---|---|---|---|
| 2,957,046 | 10/1960 | Freeman et al. | 179/2 AS |
| 3,662,347 | 5/1972 | Fox | 340/347 DD |
| 3,701,145 | 10/1972 | Bergin | 340/347 NT |
| 3,701,951 | 10/1972 | Krausser | 325/455 |
| 3,824,585 | 7/1974 | Meijer | 340/347 AD |
| 3,835,424 | 9/1974 | Marik | 325/455 |
| 3,939,459 | 2/1976 | Hoopes | 324/99 D |
| 3,973,206 | 8/1976 | Haselwood et al. | 325/31 |

*Primary Examiner*—Benedict V. Safourek
*Assistant Examiner*—Marc E. Bookbinder

*Attorney, Agent, or Firm*—Mason, Kolehmainen, Rathburn & Wyss

[57] ABSTRACT

A system for remotely monitoring or determining the channel to which a voltage tunable receiver (or CATV converter) has been tuned includes an encoder for measuring the magnitude of the tuning voltage applied to the tuning section of the receiver and for generating a channel representative digital code in response to the tuning voltage. The digital code thus generated is compatible with remotely located monitoring equipment, and represents the number of the channel to which the receiver is tuned. Since the tuning voltage is not linearly related to the channel number of the station being received, the encoder utilizes a read-only memory or the like for storing a coded representation relating the channel number to the tuning voltage. In a preferred embodiment, the coded representations are sequentially stored as tuning voltage representations in address locations of the memory corresponding to the respective channel numbers. The read-only memory locations are sequentially addressed, and the tuning voltage representations are compared with the amplitude of the tuning voltage currently being applied to the receiver. When the value of the tuning voltage representation equals or exceeds the amplitude of the tuning voltage, the sequential addressing is terminated and the address of the last accessed memory location is stored to provide a coded indication of the channel number of the station being received.

15 Claims, 7 Drawing Figures

MONITORING SYSTEM FOR VOLTAGE TUNABLE RECEIVERS AND CONVERTERS UTILIZING VOLTAGE COMPARISON TECHNIQUES

BACKGROUND OF THE INVENTION

This invention relates generally to remote monitoring systems, and more particularly, to systems for remotely determining the number of the channel to which a remotely located voltage tunable receiver (or CATV converter) has been tuned.

With the advent of voltage tunable television receivers and CATV converters, it is possible to determine the number of the channel being received by the receiver or converter by monitoring the tuning voltage applied to the receiver or converter; however, the nonlinear relationship between the tuning voltage and the channel number as well as the wide variation in tuning voltage necessary to tune different receivers to the same channel has heretofore precluded the use of the tuning voltage as an indication of the number of the channel to which the receiver is tuned.

SUMMARY OF THE INVENTION

Accordingly, an object of the present invention is to provide a new and improved remote monitoring system for determining the channel to which a voltage tunable receiver or converter is tuned.

In accordance with a preferred embodiment of the present invention, the tuning voltage from a television receiver or a CATV converter is applied to an encoder that generates a binary signal representative of the number of the channel to which the receiver (or converter) is tuned as determined by the amplitude of the tuning voltage. In a preferred embodiment, the encoder contains a read-only memory having a plurality of address locations, each address location corresponding to the channel number of one of the channels to be received. Each address location has stored therein a binary representation of the tuning voltage necessary to tune the receiver (or converter) to the channel corresponding to that address location. Alternately, if the address locations are to be sequentially accessed, only the differences in tuning voltage between serially disposed channels may be stored. The encoder also includes comparison circuitry for sequentially comparing the magnitude of the tuning voltage applied to the receiver (or converter) with the amplitude of the voltage represented by the binary representations stored in the read-only memory. The comparison circuitry may include an analog comparator and a digital-to-analog converter that converts the digital signals stored in the read-only memory to an analog signal for comparison with the tuning voltage. Alternately, a digital comparator may be used and an analog-to-digital converter employed to convert the tuning voltage to a digital signal for comparison with the contents of the read-only memory. A control circuit responsive to the output of the comparator is utilized to suspend the sequential comparison operation when the amplitude of the voltage represented by the information stored in the read-only memory is within a predetermined range of values of the tuning voltage and to generate a binary signal representative of the address location of the last compared information, the latter address location corresponding to the specific channel number to which the receiver is tuned.

When the address locations of the read-only memory are sequentially accessed, the number representing the channel number is equal to the number of steps in the sequence that occurred prior to the suspension of the sequencing operation. This number may be easily generated by utilizing a clock and a counter to sequentially address the read-only memory, the count in the counter following the suspension of the sequencing operation being representative of the received channel number.

BRIEF DESCRIPTION OF THE DRAWING

The above and other objects and advantages and novel features of the present invention will become apparent from the following detailed description of a preferred embodiment of the invention illustrated in the accompanying drawing wherein.

DETAILED DESCRIPTION OF THE INVENTION

Figure 1:
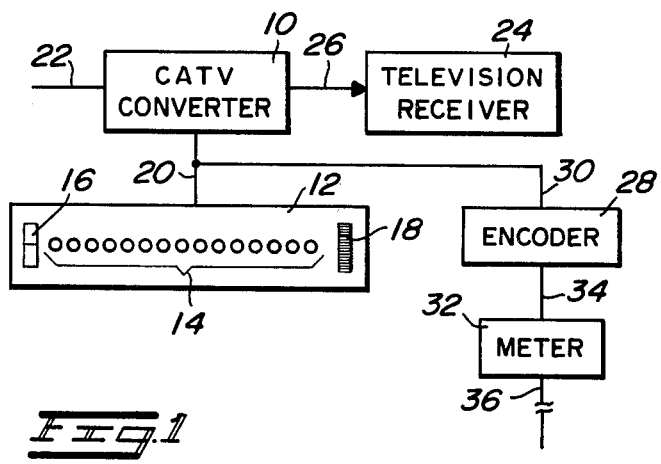
FIG. 1 is a generalized block diagram of a CATV television system embodying a monitoring system constructed in accordance with the principles of the present invention.

Referring now to the drawing, and particularly to FIG. 1, there is illustrated a CATV (community antenna television) converter 10 having a frequency of operation that is controlled by a direct current tuning voltage supplied to the converter 10 from a control plane 12. The control panel 12 contains, in this embodiment, fifteen push-button switches 14 and a band switch 16 that switches the push-button switches 14 from a high band to a low band to permit 30 channels to be selected by the control panel 12. A thumb wheel adjustment 18 provides fine tuning of each of the selected channels.

The control panel 12 contains a plurality of resistive dividers (not shown). The voltage division ratio of the resistive dividers is controlled by the push buttons 14, the band switch 16 and the fine tuning adjustment 18 which cooperate to provide a variable tuning voltage to the converter 10 via a conductor 20. The variable voltage applied to the converter 10 from the conductor 20 is applied to one or more voltage variable capacitance diodes (not shown) which adjust the tuning of the converter 10 to cause the converter 10 to convert the frequency of signals received from the community antenna (via a cable 22) to a fixed frequency to which a television receiver 24 is tuned. The converter 10 and the controlled panel 12 may comprise, for example, a Model RSC-2 or a Model RSC-3 converter manufactured by Jerrold Electronics. Such converters convert the CATV signal received by the cable 22 to a signal having a frequency corresponding to channel 2 or channel 3, depending upon the converter model. The television receiver 24 is then tuned to the appropriate channel and receives the converted signal via a cable 26.

The tuning voltage present on the line 20 is also applied to an encoder 28 via a line 30. The encoder 28 is responsive to the voltage appearing at the line 30 to generate a digital code signal representative of that voltage. If required, the digital code signal may be applied to a meter 32 via a line 34 that converts the signal from the encoder 28 to a signal compatible with a standard telephone line and applies the converted signal to a telephone line 36. A suitable device usable as the meter 32 is described in U.S. Pat. No. 3,651,471.

Figure 1A:
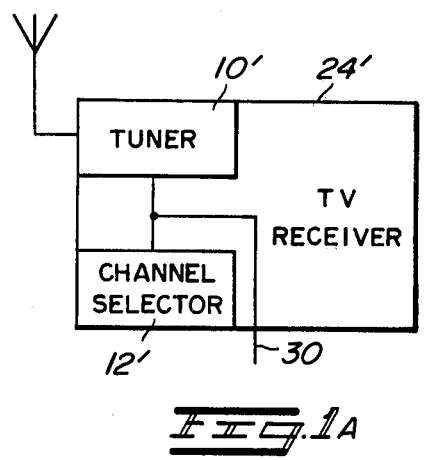
FIG. 1A is a block diagram of a voltage tunable television receiver as used in conjunction with the monitoring system of the present invention.

If a television receiver 24' (FIG. 1A) having a voltage variable tuner 10' and a channel selector 12' that applies a variable tuning voltage to the tuner 10' is employed, the line 30 may be connected directly to the output of the channel selector 12' to determine the number of the channel to which the television receiver 24' is tuned. The monitoring system according to the invention is usable with any voltage tuned receiver or converter; and, for purposes of the following discussion, the term receiver shall be defined to include both voltage tunable receivers 24' (FIG. 1A) and conventional receivers 24 (FIG. 1) utilizing a voltage tunable converter 10.

Since the voltage applied to the line 30 is not linearly related to the number of the channel to which a receiver is tuned, a system must be provided for deriving the number of the channel being received from the nonlinear voltage versus channel number relationship. Conceptually, the simplest system for deriving the channel number information from the nonlinear voltage curve is to utilize a read-only memory 38 (FIG. 2) or the like to store the channel numbers corresponding to several discrete points on a voltage versus channel number curve. An analog-to-digital converter 40 is then used to convert the voltage appearing at the line 30 to a binary representation of that voltage. The binary representation is used to address a location in the read-only memory 38 (ROM 38) having an address corresponding to the binary representation from the converter 40. The information stored in the memory location thus addressed is a binary representation of the channel number to which the receiver is tuned. This information is applied to the line 34 for processing by the meter 32 and subsequent application to the telephone line 36.

Figure 2:
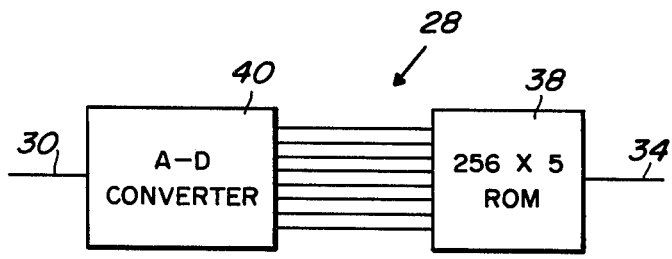
FIG. 2 is a block diagram of a simple encoder usable with the monitoring system of the present invention.

Although the scheme illustrated in FIG. 2 is conceptually simple, it suffers from the drawback that in order to define the voltage versus channel number relationship with sufficient precision to avoid ambiguity, the voltage appearing at the line 30 must be converted to at least eight bits of information. Consequently, the ROM 38 must have at least 256 locations having 5 bits each, five bits being sufficient to define the channel number for a 30-channel system. The use of an 8-bit converter 40 and a 256 × 5 ROM 38 tends to increase the cost of the system, thus making more sophisticated, lower cost approaches more attractive.

Several schemes that significantly reduce the size of the required ROM 38 and the converter 40 are illustrated in FIGS. 3-6. For example, a 32 × 8 ROM 42 (FIG. 3) is utilized to store the voltage values corresponding to the channel numbers to which the receiver may be tuned. Eight bits are sufficient to accurately define the voltage, and the 32 address locations provide storage for voltages corresponding to 32 different channels, thereby making the ROM 42 usable with a 30-channel system such as the above described Jerrold converter.

A clock 44 driving a 5-bit counter 45 sequentially addresses each of the 32 address locations in the ROM 42. The voltage representative output signal from the ROM 42 is applied to a digital-to-analog converter 46 which converts the voltage representative signal to an analog voltage having an amplitude corresponding to the value of the binary signal received from the ROM 42. The analog voltage from the digital-to-analog converter 46 is compared with the voltage present in the line 30 by an analog comparator 47, the output of which controls the clock 44.

In operation, the clock 44 applies pulses to the 5-bit counter 45 which counts the pulses and applies a binary signal to the ROM 42 to address each of the address locations sequentially. The voltage representative signals stored in the locations addressed by the counter 45 are applied to the converter 46 which converts them to an analog signal for comparison with the tuning voltage present on the line 30. The clock 44 continues to run until the analog voltage from the converter 46 reaches an amplitude that equals or exceeds the amplitude of the voltage present on the line 30. At this point, the comparator 47 generates a signal to stop the clock 44 to freeze the count in the 5-bit counter 45. The count in the 5-bit counter 45, which is equal to the total number of clock pulses received, is representative of the last addressed address location of the ROM 42. Since the address locations of the ROM 42 are sequentially addressed, it is also representative of the number of the channel having a tuning voltage substantially similar to the value represented by the last addressed memory location. The channel number indicating code is applied to a 5-bit register 48 for application to the line 34 and the meter 32.

In an alternate embodiment, the clock 44 may be allowed to run continuously, and the output of the 5-bit counter 45 strobed into the 5-bit register 48 only during the transition that follows the count that causes the output of the converter 46 to exceed the voltage on the line 30. In such an embodiment, the connection between the output of the comparator 47 and the clock 44 would be eliminated, and the output of the comparator 47 would be connected to the strobe terminal of the 5-bit register 48 by means of the dotted line 50. In addition, suitable circuitry for resetting the counter would have to be provided, and such circuitry will be described in a subsequent portion of the application.

Figure 3:
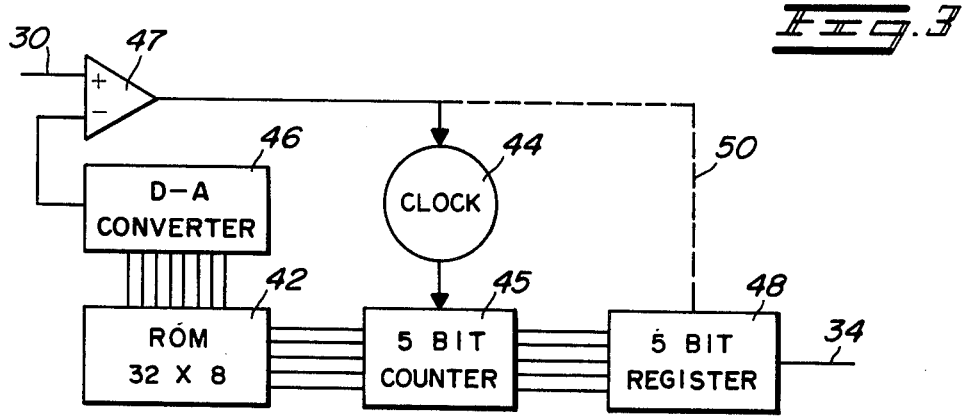
FIG. 3 is a block diagram of a preferred embodiment of an encoder usable with the monitoring system of the present invention having a lower capacity read-only memory than that of the embodiment illustrated in FIG. 2.
Figure 4:
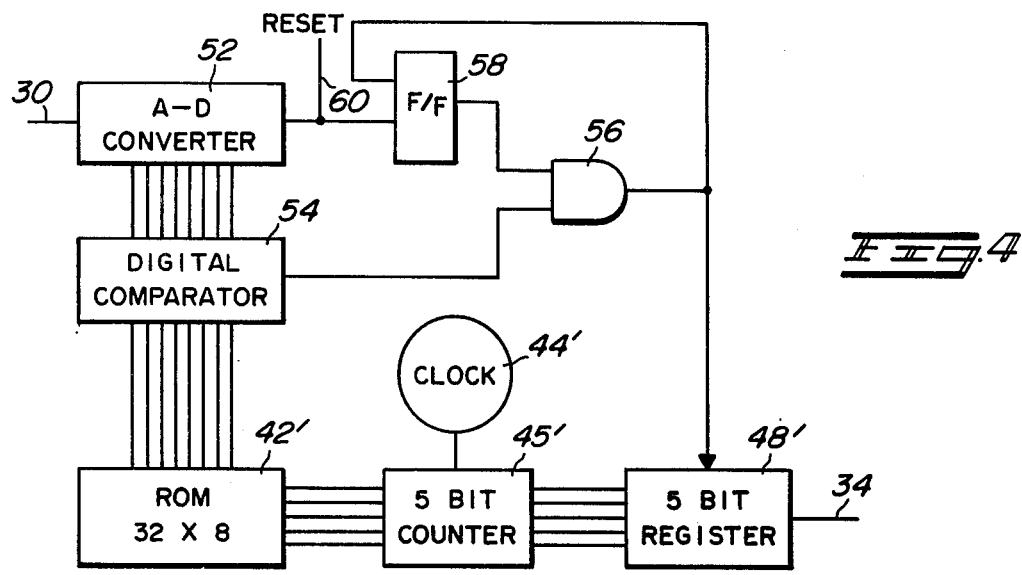
FIG. 4 is a block diagram of an alternative embodiment of the encoder illustrated in FIG. 3.

In the embodiment illustrated in FIG. 3, the comparison of the tuning voltage present on the line 30 and the value of the voltage representative signals stored in the ROM 42 is accomplished by the analog comparator 47; however, in certain applications it may be desirable to utilize a digital comparator to effect the comparison. A system utilizing a digital comparator is illustrated in FIG. 4. The system of FIG. 4 utilizes a ROM 42', a clock 44', a 5-bit counter 45' and a 5-bit register 48' similar in function and construction to the respective ROM 42, clock 44, 5-bit counter 45 and 5-bit register 48 illustrated in FIG. 3. The system illustrated in FIG. 4, however, utilizes an analog-to-digital converter 52 to convert the analog voltage present on the line 30 to a digital signal, and a digital comparator 54 for comparing the output of the converter 52 directly with the digital output from the ROM 42'. As in the previous embodiment, the clock 44' and the 5-bit counter 45' sequentially address the address locations of the ROM 42' until the number provided by the ROM 42 exceeds the number provided by the converter 52. At this point, the instantaneous count from the counter 45' is strobed into the 5-bit register 48' for application to the line 34.

In order to prevent subsequent address locations having stored values higher than the output of the converter 52 from being strobed into the 5-bit register 48', an AND gate 56 is enabled by a flip-flop 58 to permit the output of the comparator 54 to strobe the register 48'. Subsequent to the first strobing of the register 48', the output of the AND gate 56 sets the flip-flop 58 to disable the AND gate 56 to prevent the passage of subsequent strobing signals from the comparator 54 to the register 48'. The whole system is reset by a reset signal periodically applied to a line 60. A similar strobing system may be utilized with the circuit illustrated in FIG. 3, or a window comparator (described in conjunction with FIG. 5) may be utilized to achieve the same result.

More specifically, the circuit of FIG. 3 utilizes an operational amplifier 70 (FIG. 5) connected as a voltage follower for converting the voltage applied to the line 30 from the high impedance tuning circuit to a low impedance voltage source. Typically, the operational amplifier 70 has approximately unity gain and is physically located near the television tuner or converter to minimize the pick up of noise and interference. The output impedance of the amplifier 70 is very low, thereby permitting the use of a relatively long cable between the output of the amplifier 70 and the input of a subsequent amplifier 72 which provides an output current to an amplifier 74 proportional to the magnitude of the voltage applied to the line 30.

The clock 44 comprises a pair of NAND gates 76 and 78 which are hooked up as an astable multivibrator in a conventional fashion. To insure starting, the gates 76 and 78 are biased in a linear region of their transfer function. Unequal value coupling capacitors 80 and 82 are utilized to decrease the rise and fall times of the transitions to provide more reliable clocking. The operating frequency of the clock 44 is selected to be approximately 1KHz in this embodiment but faster operation is possible, if desired.

The output of the gate 78 is connected to the 5-bit counter 45 formed by a 4-stage counter 84 and a type JK flip-flop 86 which serves as the fifth stage of the counter 45. The 5-bit counter 45 is continuously cycled from 0 to 31 to cycle the ROM 42 through all possible addresses. The ROM 42 may be fabricated from any commercially available read-only memory or programmable read-only memory such as the Signetics 8223 programmable read-only memory. The 8223 programmable read-only memory (PROM) is a programmable read-only memory having 32 words with 8 binary bits per word. The memory is programmed by selectively blowing out fusible links in the memory. The fusible links may be blown out either manually or under the control of a computer. In the latter case, the computer may be programmed to analyze the voltage versus channel number transfer function and automatically program the ROM 42 to store a binary signal representative of the tuning voltage corresponding to each channel.

The 8 outputs of the ROM 42 are connected to the eight inputs of the digital-to-analog converter 46 and to a source of positive potential through eight biasing resistors 86. The digital-to-analog converter 46 may be fabricated from a variety of integrated circuits, for example, the Motorola MC 1408 L-8 digital-to-analog converter. The digital-to-analog converter 46 converts the 8-bit binary input from the ROM 42 into an analog current signal, the magnitude of the analog current signal being proprotional to the binary number provided by the ROM 42. A circuit comprising a potentiometer 88, a resistor 90 and a capacitor 92 apply a reference current to the digital-to-analog converter 46 to control the magnitude of the current signal applied to the output lead 87. In this embodiment, the digital-to-analog converter 46 is programmed to provide an output current on the lead 87 having a magnitude equal to the reference number divided by 255 times the reference current.

The current signal applied to the line 87 is applied to the noninverting input of the operational amplifier 74 together with the output current from the operational amplifier 72. The output current from the operational amplifier 72 has a positive polarity and is applied to the noninverting input of the amplifier 74 through a resistor 89. The current applied to the line 87 has a negative polarity, and the noninverting input of the amplifier 74 serves as a current summing point for the respective positive and negative currents from the amplifier 72 and the line 87. As a result, the output of the amplifier 74 is a function of the difference in the magnitudes of the positive and negative currents applied to the summing point, and the amplifier serves as a comparator to compare the magnitudes of the currents from the amplifier 72 and the line 87.

The 5-bit register 48 may have many configurations, and in this embodiment, is constructed from five type-D flip-flops 94. The flip-flops 94 are strobed at the appropriate time to store the number contained in the five-stage counter 45 at the time of the strobing. The outputs of the flip-flops 94 are applied to five output lines 34A, 34B, 34C, 34D and 34E which are represented as a single line 34 in FIGS. 1–4 for purposes of simplicity.

In operation, the variable tuning voltage from the line 30 is applied to an inverting input of the amplifier 72 by the unity gain impedance transforming amplifier 70. The tuning voltage applied to the inverting input of the amplifier 72 has a range of approximately −2 to −20 volts in this embodiment. The amplifier 72 inverts the polarity of the tuning voltage and divides it by two to provide an output voltage having a range of approximately 1 to 10 volts. A capacitor 96 and a resistor 98 are utilized in a feedback loop around the amplifier 72 to reduce the 60-cycle hum and noise at the output of the amplifier 72.

The ROM 42 is sequentially stepped through its 32 address locations beginning at location zero and proceeding through location 31. This causes the digital-to-analog converter 46 to gradually increase the magnitude of the negative analog output current applied to the line 87 in a step or staircase pattern, the size of each step corresponding to the count stored in each location of the ROM 42. The output current reaches a maximum at count 30 and is reduced to zero at count 31, thereby providing a repetitive staircase signal.

The positive current from the amplifier 72 and the negative current from the line 87 are summed at the non-inverting input of the amplifier 74. Initially, the magnitude of the positive current from the amplifier 72 is greater than the magnitude of the negative current from the line 87, and the output of the amplifier 74 is positive. When the magnitude of the staircase current on the line 87 exceeds the magnitude of the positive current from the amplifier 72, the potential at the noninverting input of the amplifier 74 goes negative, thereby causing the output of the amplifier 74 to switch from a positive to a negative potential. This causes the output of an OR gate 100 connected to the amplifier 74 to go high, thereby enabling the output of a type-D flip-flop 102 connected to the gate 100 to go low. The flip-flop 102 is toggled to its low output state by the next positive transition of the clock signals following the enabling of the flip-flop 102 by the gate 100. The clock signal is applied to the flip-flop 102 via a line 104.

The output of the flip-flop 102 is connected to a set input of a JK flip-flop 105 which provides a one at its noninverting terminal to strobe the data from the 5-bit counter 45 into the 5-bit register 48. The inverting output of the flip-flop 105 provides a zero to reset the flip-flop 102 and hold it in the reset state. The flip-flop 105 remains set until after the five-stage counter completes its counting cycle, at which time the magnitude of the output current from the digital-to-analog converter 46 drops below the magnitude of the current from the amplifier 72, and the amplifier 74 changes state to permit the gate 100 to reset the flip-flop 102. As a result, data is strobed into the register 48 only once during each counting cycle.

If, for some reason, the magnitude of the current applied to the line 87 does not exceed the magnitude of the current from the amplifier 72, the output of the amplifier 74 will not go low. For this reason, a gate 106 is connected to the counter 45 and to an input of the gate 100 to cause the output of the gate 100 to go high when the counter 45 reaches a count of 31 (all ones). The 31 count will be transferred to the output register 48 on the subsequent positive transition of the clock to indicate "unidentified viewing".

In addition, to further reduce the probability of error, a parity circuit 110 is employed. the parity circuit 110 includes four exclusive-OR gates 112, 114, 116 and 118, a 5-input NAND gate consisting of a gate 120 and a diode 122, a 2-input NAND gate 124 and a PNP transistor 126. The function of the circuit 110 is to provide a parity bit whenever the output of the 5-bit register 48 contains an even number of ones, thus causing the total number of ones present at the output leads 34A through 34F to be odd at all times (odd parity). If the output of the 5-bit register 48 contains all zeros, the gate 120 causes a zero parity bit to be generated. All zeros is an incorrect parity code and indicates that the tuning voltage is excessively low, a condition usually indicative of a malfunction, such as a broken lead or the like, in the monitoring system. The voltage follower transistor 126 switches on when power is lost. This gives a negative logic one bit which is interpreted as "TV set off" by the (battery powered) data storage device.

Figure 6:
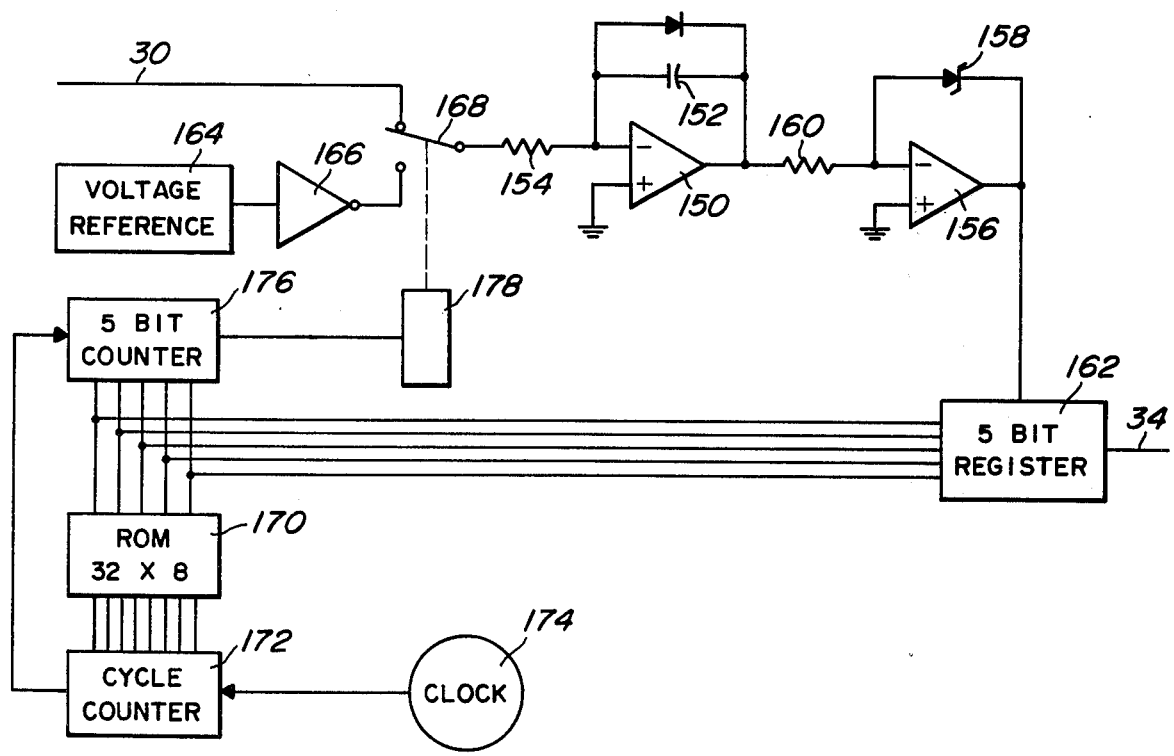
FIG. 6 is a combined block and schematic diagram of another embodiment of an encoder for use with the monitoring system of the present invention.
Figure 5:
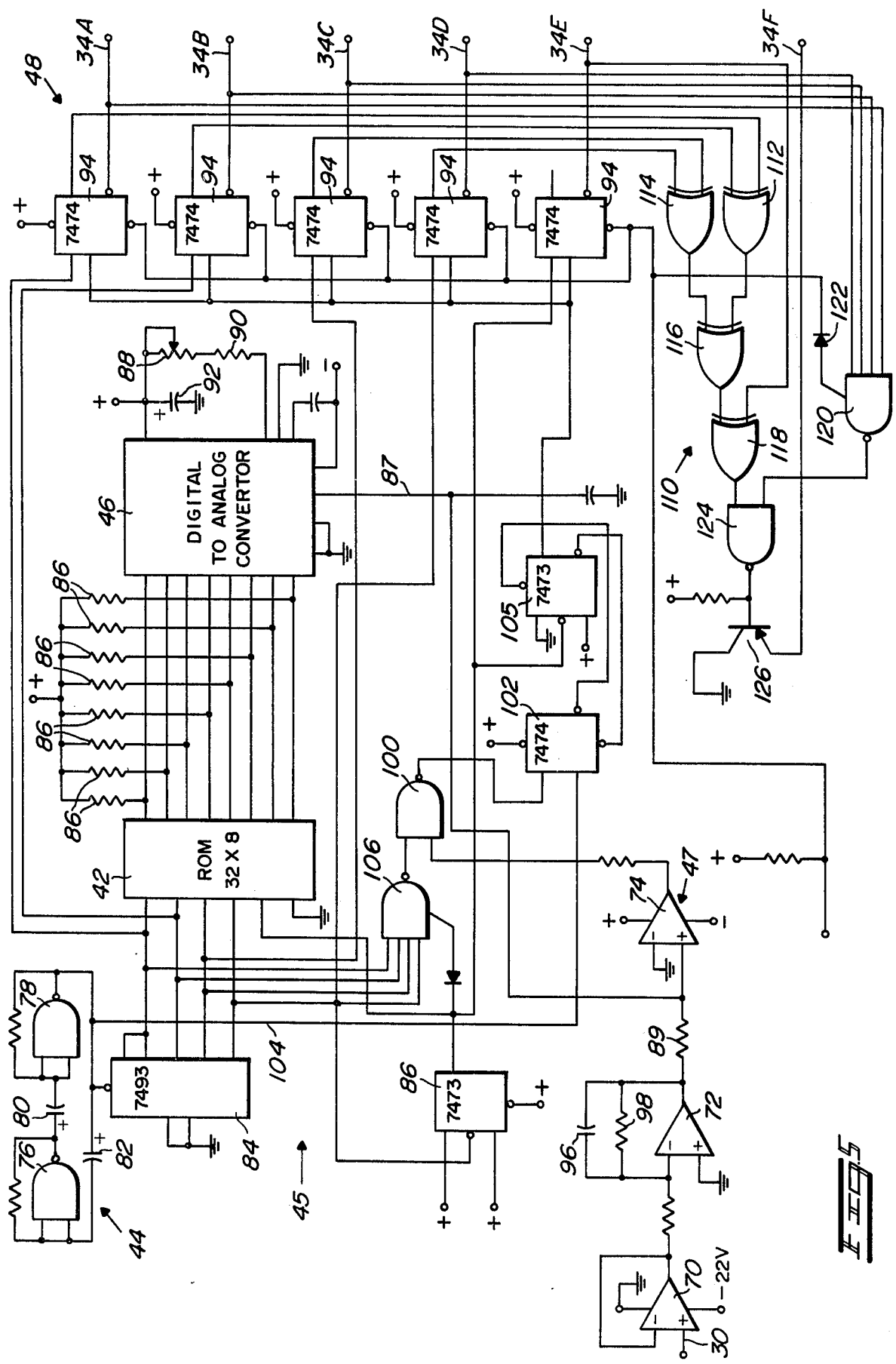
FIG. 5 is a detailed schematic diagram of the preferred embodiment of the encoder illustrated in FIG. 3.

The system illustrated in FIG. 6 is similar to that illustrated in FIG. 3 with the exception that a dual-slope integrator serves as the digital-to-analog converter. The duel-slope integrator utilizes an operational amplifier 150 having a capacitor 152 connected between the output and the inverting input of the amplifier, and operates as a Miller effect capacitance multiplier. A resistor 154 is connected to the inverting input of the amplifier 150 and forms a long time constant integrator together with the Miller effect capacitance multiplier. A comparator comprising an operational amplifier 156 and a Zener diode 158 is connected to the output of the amplifier 150 by means of a coupling resistor 160. The comparator senses the zero crossing of the output of the amplifier 150 and provides a low level output signal when the output of the amplifier 150 is above zero volts and a high level signal when the output of the amplifier 150 crosses zero volts. The output of the amplifier 156 is utilized to strobe a 5-bit register 162.

The intergrator circuit is alternately charged by the voltage present at the line 30 and discharged by a discharging circuit comprising a voltage reference circuit 164 and an inverter 166. A switch 168 is utilized alternately to connect the resistor 154 to the line 30 and the output of the inverter 166. The switch 168 is shown as a mechanical switch for purposes of illustration; in practice, an electronic switch utilizing, for example, a plurality of transistors, would be used.

The operation of dual-slope integrators is well known, and many variations of dual slope integrators are described in the prior art. In such dual-slope integrators, the integrator is first charged by the variable voltage source (line 30) for a fixed period of time. The charge on the integrator, represented by the output voltage of the amplifier 150, at the end of the charging time is proportional to the amplitude of the variable voltage on the line 30. Subsequently, the switch 168 is switched to connect the output of the inverter 166 to the amplifier 150. The polarity of the output voltage from the inverter 166 is opposite that of the voltage present on the line 30, and the length of time required to discharge the integrator sufficiently to bring the output of the amplifier 150 to zero volts is indicative of the voltage present on the line 30.

In linear digital-to-analog converters, such as the one described above, the amount of time required to discharge the integrator circuit is determined by utilizing a clock/counter combination to count the number of clock periods required to bring the output voltage of the amplifier 150 to zero volts; however, in order to provide for a nonlinear conversion, the output of the clock must be modified prior to being counted by the counter. This is accomplished by a read-only memory 170 and a cycle counter 172 interposed between a clock 174 and a 5-bit counter 176.

Stored in the read-only memory 170, are the two's complement numbers of the voltage difference between channels, stored as the negative number of clock pulses required for the integrator to discharge through that voltage difference. The sequence initially starts with the variable voltage on the line 30 being applied to the integrator. The system cycles through the entire read-only memory 170. Each count stored in the read-only memory 170 is sequentially loaded into the cycle counter 172, and the 5-bit read-only memory address counter 176 is stepped each time the cycle counter 172 "turns over" or overflows. An extra stage 178 is added to the 5-bit counter 176 to cause the switch 168 to connect the input of the amplifier 150 to the output of the inverter 166 when the output of the 5-bit counter 176 overflows into the stage 178.

During the time that switch 168 connects the input of the amplifier 160 to the output of the inverter 166, the integrator is gradually discharged. The cycle counter 172 and the 5-bit counter 176 are stepped through the same sequence of addresses by the clock 174 until the output of the amplifier 150 is reduced to zero volts. At this point, the output of the 5-bit counter 176 is strobed into the 5-bit register 162 to store the address of the read-only memory 170 corresponding to the channel number to which the receiver is tuned in the 5-bit register 162. This system avoids the need for the complex resistor switching networks utilized in most digital-to-analog converters.

Obviously, many modifications and variations of the present invention are possible in light of the above teachings. Thus, it is to be understood that, within the scope of the appended claims, the invention may be practiced otherwise then as specifically described.

What is claimed and desired to be secured by Letters Patent of the United States is:

1. Apparatus for determining at a central location the channel to which a remotely located receiver tunable to a plurality of channels by a tuning voltage has been tuned comprising:
   means for sequentially generating a plurality of digital indications of numbers identifying said channels;
   means responsive to said channel number digital indication generating means for sequentially generating a plurality of coded representations of voltages, each said coded representations corresponding to one of said digital indications and being nonlinearly related to said digital indications;
   means for sequentially comparing each of said coded representations with the tuning voltage applied to said receiver;
   means responsive to said sequentially comparing means for generating a digital code representative of the digital indication corresponding to the coded representation representing a voltage having an amplitude within a predetermined range of amplitudes relative to the amplitude of the tuning voltage applied to said receiver; and
   means for transmitting said digital code to the central location.

2. Apparatus as recited in claim 1 wherein said coded representation generating means includes a memory having a plurality of storage locations for storing said coded representations of voltages therein.

3. Apparatus as recited in claim 2 wherein said memory includes a programmable read-only memory.

4. Apparatus as recited in claim 2 wherein said channel number digital indication generating means includes a clock producing timing signals and a counter operatively coupled to said clock and counting said timing signals, the count in said counter being representative of both one of said storage locations and the channel number digital indication corresponding to said one of said storage locations.

5. Apparatus as recited in claim 4 wherein said digital code generating means includes means operatively coupled to said counter for providing an output signal representative of the count present in said counter when the value of the coded representation of voltage stored in the addressed memory location is within said predetermined range of values relative to the amplitude of said tuning voltage.

6. Apparatus as recited in claim 5 wherein said digital code generating means includes an output register.

7. Apparatus as recited in claim 5 wherein said sequentially comparing means includes means responsive to said coded representations of voltage for providing an analog signal having an amplitude proportional to the value of said coded representations of voltage and means for comparing the amplitude of said analog signal and the amplitude of said tuning voltage, said output signal providing means being responsive to said amplitude comparing means for providing said count representative output signal when the amplitude of said analog signal is within a predetermined range of amplitudes relative to the amplitude of said tuning voltage.

8. Apparatus as recited in claim 7 wherein said analog signal providing means includes a digital-to-analog converter and wherein said comparing means includes an analog comparator.

9. Apparatus as recited in claim 5 wherein said sequentially comparing means includes means responsive to the amplitude of said tuning voltage for providing a digital signal representative of the amplitude of said tuning voltage and means for comparing the values of said tuning voltage representative digital signal and said coded representations of voltage, said output signal providing means being responsive to said values comparing means for providing said count representative output signal when the values of said tuning voltage representative digital signal are within a predetermined range of values relative to the values of said coded representation of voltage.

10. Apparatus as recited in claim 9 wherein said tuning voltage representative digital signal providing means includes an analog-to-digital converter and wherein said values comparing means includes a digital comparator.

11. A method for determining the channel to which a remotely located voltage tunable receiver is tuned comprising the steps of:
   monitoring the amplitude of the tuning voltage applied to the voltage tunable receiver;
   sequentially generating a plurality of digital indications, each representative of a channel number;
   generating a coded representation of voltage in response to each channel number digital indication, each coded representation corresponding to a voltage operative to tune said receiver to a respective channel, said coded representations being nonlinearly related to said digital indications;
   comparing each of said coded representations with the tuning voltage applied to the receiver;
   generating a digital code representative of the channel to which the receiver is tuned when said coded representation has a predetermined relationship to said tuning voltage; and
   transmitting an indication of the channel representative digital code to a central location.

12. A method as recited in claim 11 wherein the step of comparing each of said coded representations with the tuning voltage applied to the receiver includes the steps of:
   generating a coded representation of the tuning voltage applied to the receiver; and
   comparing the values of said coded representation of said tuning voltage and the generated representations of voltage.

13. The method as recited in claim 11 wherein the step of generating the plurality of digital indications includes the steps of generating a plurality of timing signals, counting the timing signals to provide a variable count signal, the count in said count signal being representative of a channel to which the receiver is tuned; and
   the step of generating the plurality of coded representations of voltage includes the step of addressing a memory circuit which said counter, each count in the counter defining a unique address location having one of said representations of voltage stored therein.

14. A method as recited in claim 13 wherein the step of comparing each of said coded representations with the tuning voltage applied to the receiver includes the steps of:
   providing an analog voltage proportional to the tuning voltage applied to the receiver;
   providing an analog voltage having an amplitude proportional to the value of the coded representation of voltage in the addressed memory location; and
   comparing the amplitudes of the tuning voltage representative signal and the analog voltage representative of the coded representation stored in the addressed memory location.

15. A method as recited in claim 14 wherein the step of generating the digital code representative of the channel includes the step of sampling the count in said counter when the tuning voltage and the analog voltage have substantially similar amplitudes.

* * * * *